United States Patent [19]

Knowles

[11] 4,017,143

[45] Apr. 12, 1977

[54] SOLDERLESS ELECTRICAL CONTACT

[75] Inventor: Robert Gordon Knowles, Litchfield, Conn.

[73] Assignee: Litton Systems, Inc., Beverly Hills, Calif.

[22] Filed: Dec. 16, 1975

[21] Appl. No.: 641,386

[52] U.S. Cl. .......................... 339/221 R; 339/17 C

[51] Int. Cl.$^2$ .......................................... H05K 1/12

[58] Field of Search ........... 339/17 R, 17 C, 220 R, 339/221 R

[56] References Cited

UNITED STATES PATENTS

| | | | |
|---|---|---|---|
| 2,755,453 | 7/1956 | Cloutier | 339/220 R |
| 3,185,952 | 5/1965 | Potter et al. | 339/17 R |
| 3,444,504 | 5/1969 | Lynch et al. | 339/221 R |
| 3,783,433 | 1/1974 | Kurtz et al. | 339/17 C |
| 3,846,741 | 11/1974 | Kunkle et al. | 339/221 R |

*Primary Examiner*—Roy Lake
*Assistant Examiner*—Mark S. Bicks
*Attorney, Agent, or Firm*—M. Michael Carpenter

[57] ABSTRACT

A solderless electrical contact is shcwn having first and second ends for connection to conductive elements joined by a central section having a C-shaped cross section with opposing arms tapering to a reduced end thickness for press-fit mounting into a printed circuit board aperture. The tapering arms of the C-shaped cross section provide uniformly stressed beams that allow the radii of each arm to better conform to tolerance variations of the aperture without creating undue stresses therein.

9 Claims, 9 Drawing Figures

SOLDERLESS ELECTRICAL CONTACT

BACKGROUND OF THE INVENTION

The present invention relates to an electrical contact and, more particularly, to a contact which may be inserted into an aperture within an insulated mounting board, such as a printed circuit board, for making electrical contact with conductive paths thereon without requiring solder. The contact is also utilized to make electrical contact with other conductive elements associated with the printed circuit board.

In the prior art, solderless electrical contacts have been secured within plated-through holes in printed circuit boards by using a square pin in a round hole. This configuration has the disadvantage of mechanically deforming the hole upon insertion, thus making repeated insertions impractical. The square pin configuration also produces an inferior electrical connection between the contact and the hole since the ambient atmosphere is free to circulate between the two, which allows a corrosive, non-conductive film to develop therebetween.

Electrical contact configurations have been proposed to reduce the degrading effect of the square pin in a round hole. See, for example, U.S. Pat. No. 3,545,080 W. R. Evans, which issued on Dec. 8, 1970, and U.S. Pat. No. 3,824,554 by G. D. Shoholm, which issued on July 16, 1974.

A more practical approach for retaining an electrical contact in a plated-through hole without requiring solder is disclosed in U.S. Pat. No. 3,783,433 by H. N. Kurtz et al, which issued on Jan. 1, 1974 and which is assigned to the same assignee as the present invention. This patent discloses a contact spring section that engages a plated-through hole without deforming the hold while providing a gas-tight seal therebetween for preventing deterioration of the electrical connection.

However, the spring section of the Kurtz contact requires a wide spacing between the consecutively spaced contacts as they are stamped from a flat sheet of metal stock. Further, the sheet metal from which the Kurtz contact is formed requires a thick and thin section. To form the Kurtz contact, the metal stock must be milled prior to stamping. Due to the substantial dimensional difference between the thick and thin sections, the milling requirement is a major consideration in the contact cost.

SUMMARY OF THE INVENTION

The present invention provides an improved contact which may be formed from flat sheet metal stock without a required milling step or, in some embodiments, with a reduced requirement. The present invention provides an electrical contact with a central cross section which may be inserted into an aperture, such as a plated-through hole of a printed circuit board, without using solder. The central section may also be inserted into the plated-through hole without mechanically deforming the hole while providing a gas-tight seal between the contact and the hole. Further, the central section of the present invention provides a contact configuration which easily conforms to various sized apertures for providing improved mechanical and electrical contact over a wider tolerance range. Still further, the configuration of the central section provides electrical contacts that are more easily fabricated and fabricated on closer centers than prior art contacts having the same mechanical and electrical advantages.

The present invention accomplishes the foregoing advantages by providing an electrical contact having a central section formed with a C-shaped cross section whose opposing arcuate arms taper toward a reduced thickness at each end thereof. This configuration provides two uniformly stressed beam sections which allow the radii of each arcuate arm to better conform to various sized apertures.

Other advantages and further objects of the present invention will become apparent to those skilled in the art after a careful consideration of the following specification and accompanying drawings, wherein:

DESCRIPTION OF THE PREFERRED EMBODIMENT

Figure 1:
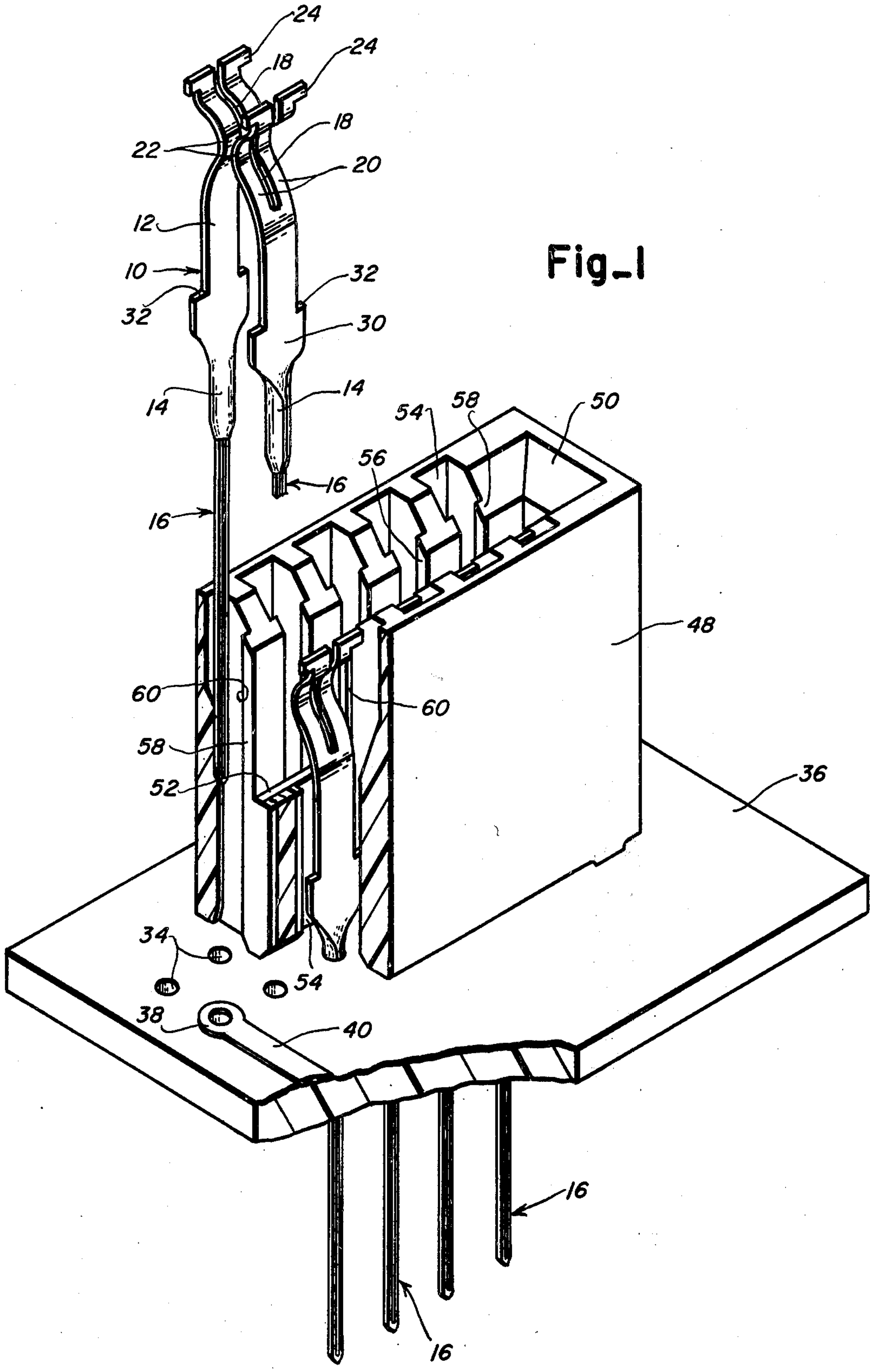
FIG. 1 is a perspective view showing a solderless electrical contact mounted in a printed circuit board and in an insulated housing.
Figure 2:
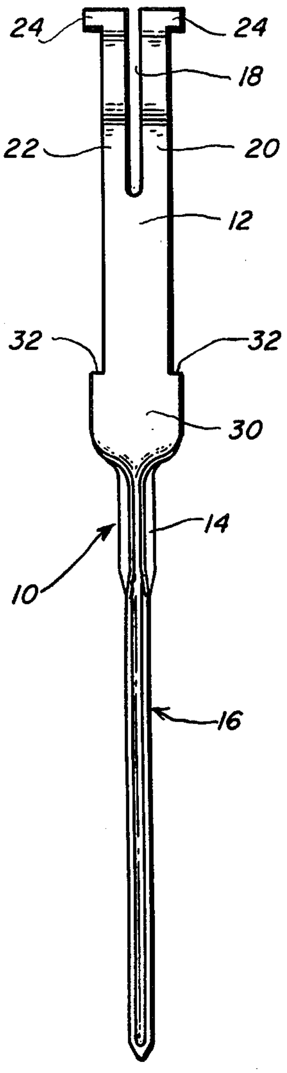
FIG. 2 is a front elevational view of the electrical contact.
Figure 3:
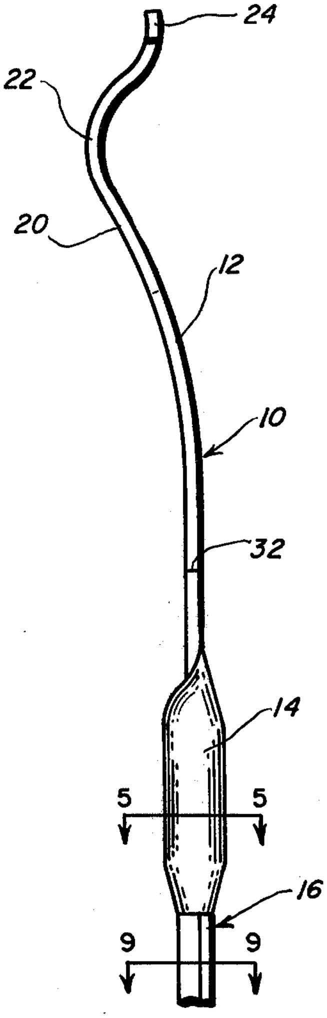
FIG. 3 is a partial side elevational view of the contact.

The solderless electrical contact of the present invention is shown in FIGS. 1–3 at 10 having an upper cantilever section 12, a central section 14, and a lower wire-wrap tail section 16. The cantilever section 12 is formed by a flat cantilever arm that is bifurcated by a slot 18 to form two spring arms 20 which are inwardly bowed at 22 before terminating at the uppermost ends thereof with outwardly extending tabs 24. It will be understood by reference to the Kurtz patent that equivalent upper sections may be substituted for the cantilever section 12 shown herein, including a socket section for receipt of an electrical contact extending from an integrated circuit, a rounded pin, or a square pin.

Figure 5:
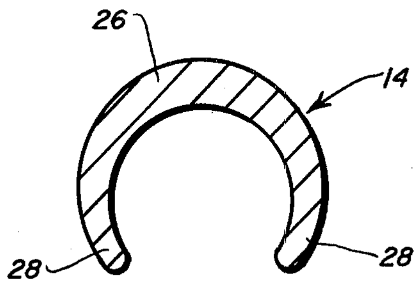
FIG. 5 is a cross-sectional view taken along line 5—5 of FIG. 3.
Figure 6:
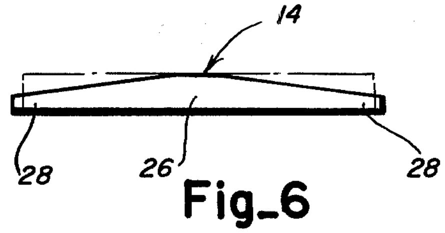
FIG. 6 is a cross-sectional view of the central section shown in FIG. 5 prior to forming.
Figure 4:
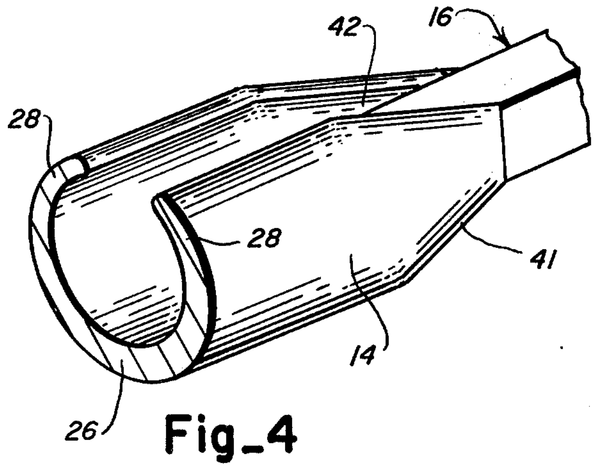
FIG. 4 is a perspective view of the electrical contact showing its central section in cross section.

The central section 14, best seen in FIGS. 4 and 5, includes a C-shaped cross section 26 formed by oppositely extending arcuate arms 28 which taper toward a reduced cross-sectional thickness at the ends of each arm as shown in FIG. 6 to be discussed further hereinbelow.

The upper portion of the central section 14 merges with the lower portion of the cantilever section 12 at a widened stop 30 which forms upper shoulders 32. The stop 30 provides a reference for the electrical contact 10 as it is inserted into an aperture 34 in an insulated mounting board 36, such as a printed circuit board. The shoulders 32 act as a working surface against which a press, not shown, engages the contact 10 for insertion into the apertures 34 which may be arranged in two evenly spaced rows upon the board 36. Once inserted into apertures 34, with the bowed portions 22 of each contact 10 facing inwardly, the contacts will wipe against conductive paths upon a second printed circuit board, not shown, which may be inserted therebetween.

The apertures 34 in the printed circuit board 36 may or may not include plating through the entire length of each aperture. When such plating passes through the hole, it is normally connected to a conductive boss 38 which, in turn, may connect to a conductive strip 40 for completing an electrical circuit between two boards, as is known in the art.

Referring again to FIG. 4, it will be seen that the lower portion of the central C-shaped section 14 merges with the upper portion of the wire-wrap tail section 16 through a frustrum section 41 with the outer surface diameter of arms 28 diminishing to merge into the wire-wrap tail section 16. In the embodiment shown in FIGS. 4 and 7, the tail section 16 has a square cross section 17 with a typical side dimension of .025 inches. The opposing tapered arms 28 form a slot 42 between their ends which extends into the merging section 41. This slot provides resiliency for the truncated cone-shaped merging section 41, which permits it to yield as it is inserted into aperture 34, thus preventing deformation of the apertures. Due to the absence of a truncated merging section 41, some prior art contacts deform a plated-through hole into which they are inserted even though they are designed with a wire-wrap tail section which clears the hole and a central section which minimizes the deformation of the hole.

Figure 8:
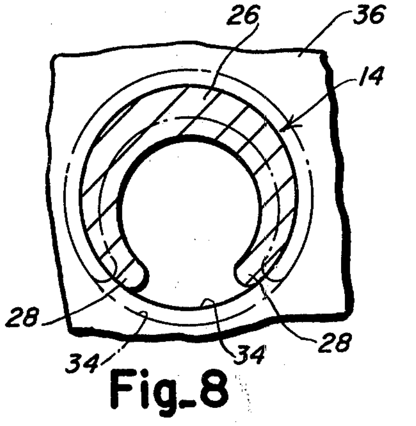
FIG. 8 is a cross-sectional view of the central section of FIG. 5 mounted in various sized apertures.

The tapering arms 28 of central section 14 provide uniformly stressed beam sections which allow the outer diameter of the central section 14 to better conform to the inside diameter of various sized apertures 34. In the preferred embodiment, the outer diameter of the central section is 0.047 inches. This diameter is designed to fit without deformation into a 0.040-inch hole having a tolerance variation of ± .003 inches. The tolerance variation for a drilled hole may be much less. However, it should be remembered that the present invention is intended to function in a drilled hole or a plated-through hole; and it is desirable to have a larger tolerance range with the latter. Thus, the central section 14 may be inserted into an aperture which has a tolerance variation of ± 7.5 percent or, from another viewpoint, into an aperture which is from 8.5 to 21 percent smaller than the outer diameter of the central section 14. The configuration of the central section in various sized apertures is best illustrated in FIG. 8.

Figure 7:
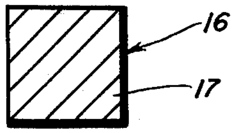
FIG. 7 is a cross-sectional view of a square wire-wrap tail shown in FIG. 4.
Figure 9:
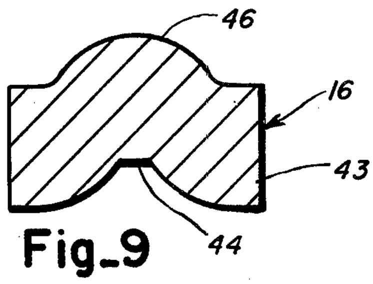
FIG. 9 is a cross-sectional view taken along line 9—9 of FIG. 3.

In the preferred embodiment, the wire-wrap tail section 16 may take several forms, including the square cross section 17 shown in FIG. 7, or a hat-shaped cross section 43, as shown in FIG. 9. The hat-shaped cross section 43 of the wire-wrap tail section 16 is formed by stamping the flat sheet metal material from which the electrical contact 10 is formed with a slot forming tool which forms a concaved slot or rib 44 in one side of the rectangularly cross-sectioned wire-wrap tail 16. The tool that forms rib 44 also swages the metal on the opposite side of the tail section into a rounded cavity to form the convexed upper rib portion 46. The rib 44–46 reinforces the wire-wrap tail section 43 which is thinner than section 17 to allow a conductive wire to be wrapped about it without bending.

As stated above, a typical square wire-wrap tail section 17 has a side dimension of 0.025 inches. The diagonal of this section is slightly larger than 0.035 inches, thus requiring a minimum clearance hole of 0.036 inches to allow the square wire-wrap tail section 17 to clear the aperture 34. The hat-shaped wire-wrap tail section 43 has a typical width of 0.033 inches with a diagonal of slightly less than 0.037 inches. Each of these embodiments of the wire-wrap tail section 16 will clear an aperture 34 having a nominal diameter of 0.040 inches.

The central section 14 has an advantage over the Kurtz patent in that the amount of metal required to manufacture the C-shaped cross section 26 is less than the amount required by the Kurtz arrangement. This allows the contacts to be formed from a flat sheet of metal on closer centers which reduces the amount of metal scrap. If a gold inlay is to be used across the bowed portions 22 which contact a second printed circuit board, the closer contact centers reduces the gold scrap considerably. The reduced distance between centers has a further advantage of allowing the contacts to be retained upon a carry strip for multiple insertion into the apertures 34. After insertion, the carry strip may be broken away along a scoremark formed just above the tabs 24.

After inserting the electrical contacts 10 into the apertures 34 in the printed circuit board 36, an insulated housing 48 may be placed over the contacts 10 for protecting the contacts and for guiding a second printed circuit board between opposing contact rows. As best seen in FIG. 1, the insulated housing includes a board receiving slot 50 which terminates at a board stop formed by a shoulder 52. On each side of shoulder 52 are passageways 54 which extend from the upper surface of the insulated housing 48 to the lower surface thereof. The passageways 54 receive the electrical contacts 10 and open at 56 into the board slot 50 to allow the bowed portions 22 of the electrical contacts 10 to extend into the slot. The opening 56 is partially restricted by vertically extending strips 58 which form shoulder 60 against which tabs 24 rest for preloading the bowed portions 22 after the housing 48 has been properly positioned over the contacts 10.

The insulated housing 48 may be attached to the printed circuit board 36 by machine screws, not shown. Alternately, the flat stop portion 30 may be provided with a detent which engages a shouldered surface of a rib formed along the lower inner surface of passageway 54. Such an arrangement is shown and claimed in the Kurtz patent.

When the square wire-wrap tail section 17 of FIG. 7 is used, sheet metal stock having a thickness equal to the thickness of the square wire-wrap section is required. The simplified tapered C-shaped section 26 of the central section 14 does not require as thin a cross section as did the Kurtz central section. This allows the thicker stock to be swaged to the thinner dimension required by section 14, thus eliminating the milling step required by the Kurtz contact. Once the thickness of the central section 14 is established by the swaging step, the tapering arms 28 of C-shaped section 26 may be formed by an additional coining step, as illustrated in FIG. 6. The flattened tapering arms 28 are then rounded through successive stages of a multi-stationed die. When the hat-shaped cross section 43 shown in FIG. 9 is used, the required sheet metal stock thickness is substantially reduced. In this embodiment, the dimensional difference between the central section 14 and the tail section 43 is nominal and in some embodiments may be zero. It is thus possible to swage the slightly thinner section required for the central section 14 with little effort. Once the maximum thickness of the C-shaped cross section 14 has been established, the tapered arms 28 are formed as described above.

The tapering C-shaped cross section 26 of the electrical contact 10 described herein has many applications. It has been found that this configuration allows the manufacturer of a printed circuit board and the plated-through holes therein to utilize a large tolerance range since the arcuate tapering arms 28 conform easily with various inside diameters of the apertures 34 with which they engage. The tapering arms 28 minimize the stress build-up within the C-shaped section 26 to provide an electrical contact 10 which engages the plated-through hole of aperture 34 without deforming the hole. Further, the tapered C-shaped cross section provides a gas-tight seal between the contact and the hole which prevents deterioration of the electrical contact made therebetween.

I claim:

1. An electrical contact for insertion into a mounting plane aperture wherein said contact comprises:

an aperture engaging section having a C-shaped cross section formed from opposing arms; and said opposing arms engaging said aperture along their outer surface to the ends thereof and tapering over a circumferential arc greater than 90° to a reduced cross-sectional thickness at the ends thereof for reducing internal stress within said C-shaped section as said section is inserted into said aperture.

2. An electrical contact for insertion into a mounting plane aperture as claimed in claim 1 wherein said C-shaped section has an outer diameter for insertion into a mounting plane aperture whose inner diameter may be from 8.5 to 21 percent smaller than said outer diameter of said C-shaped section.

3. A contact for electrical connection to conductive elements and for insertion into an insulated board having a mounting aperture therein, comprising:

a first end section for engaging a first of said conductive elements;

a second end section for engagement with a second of said conductive elements; and a center section joining said first and second end sections having a C-shaped cross section formed by opposing arms that taper over a circumferential arc greater than 90° to a reduced cross-sectional thickness for insertion into said insulated board mounting aperture.

4. A contact for insertion into an insulated board having mounting apertures as claimed in claim 1 wherein said mounting apertures are lined with a conductive layer to provide a third conductive element to which said contact may be electrically connected.

5. A contact for insertion into an insulated board having mounting apertures as claimed in claim 1 wherein said first end section merges into said C-shaped cross section through a slotted truncated cone section which prevents the deformation of said mounting aperture.

6. A contact for insertion into an insulated board having mounting apertures as claimed in claim 1 wherein said first end section includes a square cross-sectional wire-wrap tail about which said first conductive element may be wrapped.

7. A contact for insertion into an insulated board having mounting apertures as claimed in claim 1 wherein said first end section includes a hat-shaped cross sectional wire-wrap tail having a cross-sectional thickness slightly greater than said cross-sectional thickness of said C-shaped cross section.

8. A contact for insertion into an insulated board having mounting apertures as claimed in claim 1 wherein said first end section includes a hat-shaped cross-sectional wire-wrap tail having a cross-sectional thickness equal to said cross-sectional thickness of said C-shaped cross section at the thickest portion of said opposing arms.

9. An electrical contact for insertion into an aperture comprising:

a C-shaped cross section for insertion into said aperture formed from joined opposing arms having outer surfaces that engage the inner surface of said aperture along the full axial length and full circumferential width of said opposing arm surfaces;

said opposing arms tapering from the jointure thereof along the full circumferential width of said opposing arms to a reduced cross-sectional thickness at the ends thereof for reducing internal stress within the C-shaped section as said contact is inserted into said aperture.

* * * * *

UNITED STATES PATENT AND TRADEMARK OFFICE

CERTIFICATE OF CORRECTION

PATENT NO. : 4,017,143

DATED : April 12, 1977

INVENTOR(S) : Robert Gordon Knowles

It is certified that error appears in the above-identified patent and that said Letters Patent are hereby corrected as shown below:

In The Claims:

Column 6, Claim 4, line 2, change "claim 1" to --claim 3--.

Column 6, Claim 5, line 2, change "claim 1" to --claim 3--.

Column 6, Claim 6, line 2, change "claim 1" to --claim 3--.

Column 6, Claim 7, line 2, change "claim 1" to --claim 3--.

Column 6, Claim 8, line 2, change "claim 1" to --claim 3--.

Signed and Sealed this

*Fourth* Day of *March 1980*

[SEAL]

*Attest:*

SIDNEY A. DIAMOND

*Attesting Officer* *Commissioner of Patents and Trademarks*